United States Patent [19]
Koyama

[11] Patent Number: 5,429,968
[45] Date of Patent: Jul. 4, 1995

[54] METHOD OF FORMING A MASK PROGRAMMABLE READ ONLY MEMORY DEVICE WITH MULTI-LEVEL MEMORY CELL ARRAY

[75] Inventor: Shoji Koyama, Tokyo, Japan

[73] Assignee: NEC Corporation, Tokyo, Japan

[21] Appl. No.: 305,745

[22] Filed: Sep. 14, 1994

Related U.S. Application Data

[63] Continuation of Ser. No. 911,618, Jul. 10, 1992, abandoned.

[30] Foreign Application Priority Data

Jul. 12, 1991 [JP] Japan .................................. 3-198386

[51] Int. Cl.⁶ .......................................... H01L 21/265
[52] U.S. Cl. ........................................ 437/48; 437/45; 437/52; 437/101
[58] Field of Search ................ 437/44, 47–48, 437/52, 101, 45; 257/290–292

[56] References Cited

U.S. PATENT DOCUMENTS

| | | | |
|---|---|---|---|
| 4,142,176 | 2/1979 | Dozier | 307/448 |
| 4,602,354 | 7/1986 | Craycraft et al. | 365/203 |
| 4,603,341 | 7/1986 | Bertin et al. | 365/104 |
| 4,980,861 | 12/1990 | Herdt et al. | 365/203 |
| 5,002,896 | 3/1991 | Naruke | 437/48 |
| 5,126,290 | 6/1992 | Lowrey et al. | 437/52 |

FOREIGN PATENT DOCUMENTS

| | | |
|---|---|---|
| 0031496 | 7/1981 | European Pat. Off. |
| 0068845 | 1/1983 | European Pat. Off. |
| 58-51427 | 11/1983 | Japan |
| 63-160267 | 7/1988 | Japan |

OTHER PUBLICATIONS

"16–Mbit Mask ROM MN2316000", National Technical Report, vol. 36, No. 3, Jun. 1990, by E. Yamamoto, et al., pp. 270–277 (including English abstract).

"MASK ROM", Electric Wave Newspaper, Jan. 18, 1991, p. 36 and partial English translation.

Patent Abstracts of Japan, vol. 14, No. 205 (E–921)(4148) 26 Apr. 1990, & JP–A–02 044 768 (Ricoh) (Abstract).

*Primary Examiner*—Olik Chaudhuri
*Assistant Examiner*—H. Jey Tsai
*Attorney, Agent, or Firm*—Burns, Doane, Swecker & Mathis

[57] ABSTRACT

A mask programmable read only memory device comprises a plurality of memory cell blocks each having a plurality of first series combinations of memory transistors and a plurality of second series combinations of memory transistors, and each of the memory transistors is operative in either enhancement or depletion mode, wherein the plurality of first series combinations are respectively overlapped with the plurality of second series combinations so as to share word lines therebetween, thereby increasing the integration density without sacrifice of the real estate.

3 Claims, 15 Drawing Sheets

METHOD OF FORMING A MASK PROGRAMMABLE READ ONLY MEMORY DEVICE WITH MULTI-LEVEL MEMORY CELL ARRAY

This application is a continuation of application Ser. No. 07/911,618, filed Jul. 10, 1992, now abandoned.

FIELD OF THE INVENTION

This invention relates to a mask programmable read only memory device and, more particularly, to a multi-level memory cell array incorporated in a NAND type mask programmable read only memory device.

DESCRIPTION OF THE RELATED ART

The integration density of a read only memory device has been increased from 8 mega-bits to 16 mega-bits, and a NAND type mask programmable read only memory device is attractive in view of integration density.

FIG. 1 shows a part of the memory cell array incorporated in a prior art NAND type mask programmable read only memory device, and comprises a memory block 1 broken down into two memory sub-blocks 1a and 1b coupled in parallel between a bit line Y and a source line S. Though not shown in FIG. 1, the memory cell array further contains a large number of memory blocks which are arranged in rows and columns together with the memory block 1. The memory sub-block 1a is implemented by a series combination of n-channel type switching transistors Qs1 and Qs2 and n-channel type memory transistors Qm1, Qm2 and Qm3, and the other memory sub-block 1b is also implemented by a series combination of n-channel type switching transistors Qs3 and Qs4 and n-channel type memory transistors Qm4, Qm5 and Qm6. Each of the n-channel type switching transistors Qs1 to Qs4 is operative in either enhancement or depletion mode, and doping is selectively carried out for the channel regions of the n-channel type switching transistors Qs1 to Qs4 so as to form the n-channel type depletion mode switching transistors Qs1 and Qs4. Decoded signal lines Xs1 and Xs2 are coupled with the n-channel switching transistors Qs1 and Qs3 and with the n-channel switching transistors Qs2 and Qs4, respectively, and allows the n-channel type switching transistors Qs1 to Qs4 operative in either enhancement or depletion mode to selectively couple the memory sub-blocks 1a and 1b with the associated bit line Y. The n-channel type memory transistors Qm1 to Qm6 are also operative in either enhancement or depletion mode, and the n-channel enhancement mode memory transistors Qm1, Qm2, Qm4 and Qm6 and the n-channel depletion mode transistors Qm3 and Qm5 correspond to the logic levels opposite to each other. In other words, the n-channel type memory transistors Qm1 to Qm6 serve as the memory cells respectively storing data bits in non-volatile manner. The enhancement mode memory transistors Qm1, Qm2, Qm4 and Qm6 are representative of data bits of logic "1" level, and the depletion mode memory transistors Qm3 and Qm5 are representative of data bits of logic "0" level. Doping selectively carried out for the channel regions also forms the depletion mode transistors. Word lines WL1, WL2 and WL3 are coupled with the n-channel type memory transistors Qm1 and Qm4, Qm2 and Qm5, and Qm3 and Qm6, and are selectively driven to positive high voltage level.

The prior art mask programmable read only memory device behaves as follows. In order to select one of the memory sub-blocks 1a and 1b, the decoded signal lines Xs1 and Xs2 are selectively driven to positive high voltage level or 5 volts, and one of the decoded signal lines remains in low voltage level or zero voltS. If the decoded signal line Xs1 is driven to the positive high voltage level, the memory sub-block 1b is coupled with the bit line Y. However, the decoded signal line Xs2 of the low voltage level causes the memory sub-block 1a to be isolated from the bit line Y. Subsequently, remaining one of the word lines WL1 to WL3 in the low voltage level, the other word lines are driven to the positive high voltage level. The word line kept in the low voltage level selects one of the n-channel type memory transistors Qm1 to Qm3 from the selected memory sub-block 1a. If the selected memory transistor is operative in the depletion mode, any conductive channel takes place in the selected memory transistor, and the selected memory transistor cuts off the current path from the bit line Y to the source line S. However, the n-channel type depletion mode memory transistor allows current to flow from the bit line Y through the selected memory sub-block 1a to the source line S. Thus, the selected memory transistor either couples or block the source line from the bit line Y, and voltage level on the bit line Y is either decayed or kept depending upon the data bit represented by the selected memory transistor. The voltage level on the bit line Y is monitored to see whether the accessed data bit is either logic "1" or "0" level.

FIGS. 2 to 4 show a typical example of the NAND type mask programmable read only memory device, and the NAND type mask programmable read only memory device is fabricated on a p-type silicon substrate 2 lightly doped at $4 \times 10^{16}$ cm$^{-3}$. A passivation film 3 of boron phosphosilicate glass or BPSG and the bit line Y of aluminum are removed from FIG. 2 for better understanding of the layout of the prior art mask programmable read only memory device. A thick field insulating film 4 are selectively grown on the major surface of the p-type silicon substrate 2, and defines an active area 5 in the major surface of the p-type silicon substrate 2. The thick field insulating film 4 is as thick as 6000 angstroms. The active area 5 is covered with a gate oxide film 6 which is as thin as 250 angstroms. On the gate oxide film 6 are patterned polysilicon strips 7a, 7b, 7c, 7d and 7e which are 3000 angstroms in thickness. The polysilicon strips 7a to 7e respectively serve as the decoded signal lines Xs1 and Xs2 and the word lines WL1 to WL3, and provide the gate electrodes of the n-channel type switching transistors Qs1 to Qs4 and the gate electrode of the n-channel type memory transistors Qm1 to Qm6. The active area 5 under the gate electrodes serves as channel regions CQs1 to CQs4 of the n-channel type switching transistors Qs1 to Qs4 and channel regions CQm1 to CQm6 of the n-channel type memory transistors Qm1 to Qm6, and the channel regions CQs1 to cQs4 and CQm1 to CQm6 are selectively doped with n-type impurity atoms. In this instance, the channel regions CQm3 and CQm5 are doped with n-type impurity atoms at $1 \times 10^{17}$ cm$^{-3}$ so that the n-channel type memory transistors Qm3 and Qm5 is allowed to operate in the depletion mode. The other active area provides a cell drain region 5a, a cell source region 5b and source/drain regions 5c of the n-channel type switching transistors. Qs1 to Qs4 and the n-channel type memory transistors Qm1 to Qm6. The polysilicon strips 7a to 7e are covered with the passivation film 3, and a contact hole 3a is formed in the passivation film 3 and the gate oxide film 6. The contact hole thus passing through those films 3 and 6 allows the bit line Y to be held in contact with the cell drain region 5a as will be better seen from FIG. 3.

Thus, the memory cells of the prior art mask programmable read only memory device are directly arranged on the major surface of the p-type silicon substrate 2, and a problem is encountered in that the p-type silicon substrate 2 is enlarged in proportion to the number of the memory cells. In other words, when the integration density of the memory cell array is increased, the two-dimensional memory cell array requires a large-sized silicon substrate, and, accordingly, decreases the production yield.

SUMMARY OF THE INVENTION

It is therefore an important object of the present invention to provide a NAND type mask programmable read only memory device the memory cell array of which occupies a relatively small amount of the real estate of the semiconductor chip.

To accomplish the object, the present invention proposes to three-dimensionally construct a memory cell array.

In accordance with one aspect of the present invention, there is provided a mask programmable read only memory device fabricated on a single semiconductor substrate, comprising: a) a memory cell array having a plurality of first memory cell groups each containing a plurality of memory transistors each operative in either enhancement or depletion mode and a plurality of second memory cell groups each containing a plurality of memory transistors each operative in either enhancement or depletion mode, the plurality of first memory cell groups being respectively overlapped with the plurality of second memory cell groups; b) a plurality of bit lines associated with the memory cell array; c) current supplying means provided in association with the plurality of bit lines for supplying current; and d) a plurality of first addressing lines associated with the memory cell array, and operative to select memory transistors from the memory cell array, each of the plurality of addressing lines being shared between each of the memory transistors of one of the first memory cell groups and each of the memory transistors of the second memory cell group over aforesaid one of the first memory cell groups, each of the selected memory transistors allowing current to flow from one of the bit lines to a source line if aforesaid each of the selected memory transistors is operative in the depletion mode, another of the selected memory transistors blocking the current if aforesaid another of the selected memory transistors is operative in the enhancement mode.

In accordance with another aspect of the present invention, there is provided a process of fabricating a mask programmable read only memory device on a semiconductor substrate of a first conductivity type, comprising the steps of: a) preparing the semiconductor substrate; b) selectively growing a first gate insulating film over a major surface of the semiconductor substrate; c) forming a plurality of gate electrodes on the gate insulating film at spacings; d) forming first source and drain regions of a second conductivity type in the semiconductor substrate in such a manner that the gate insulating film, the plurality of gate electrodes and the first source and drain regions form in combination a series combination of enhancement mode first field effect transistors; e) covering the plurality of gate electrodes with a second gate insulating film; f) forming a semiconductor film of the first conductivity type on the second gate insulating film in such a manner as to extend over the plurality of gate electrodes, the plurality of gate electrodes; g) providing a first mask film on the semiconductor film having through holes exposing parts of the semiconductor film over first predetermined gate electrodes selected from the plurality of gate electrodes; h) implanting impurity atoms of the second conductivity type at relatively large acceleration energy, and doping the semiconductor substrate under the first predetermined gate electrodes so as to selectively converting the enhancement mode first field effect transistors into depletion mode first field effect transistors; i) removing the first mask film; j) providing a second mask film on the semiconductor film having through holes covering predetermined parts of the semiconductor film over second predetermined gate electrodes selected from the plurality of gate electrodes; k) implanting impurity atoms of the second conductivity type into the semiconductor film at relatively small acceleration energy, and doping the semiconductor film except for the predetermined parts, the gate electrodes under the predetermined parts, the second gate insulating film and the predetermined parts forming in combination enhancement mode second field effect transistors, the other of the gate electrodes, the second gate insulating film and the semiconductor film except for the predetermined parts forming in combination depletion mode second field effect transistors, the depletion mode second field effect transistors and the enhancement mode second field effect transistors being mixed for forming a series combination of second field effect transistors; and completing the mask programmable read only memory device.

BRIEF DESCRIPTION OF THE DRAWINGS

The features and advantages of the NAND type mask programmable read only memory device according to the present invention will be more clearly understood from the following description taken in conjunction with the accompanying drawings in which.

DESCRIPTION OF THE PREFERRED EMBODIMENTS

First Embodiment

Figure 1:
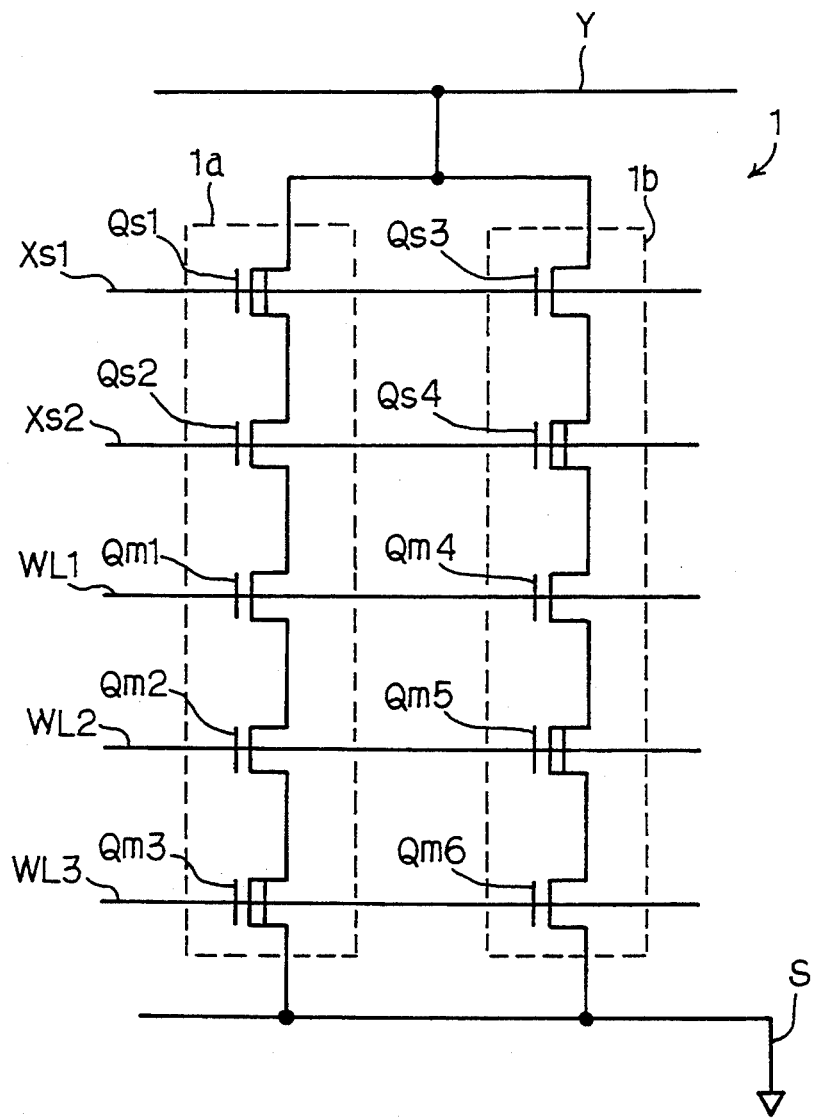
FIG. 1 is a circuit diagram showing the arrangement of the part of the memory cell array incorporated in the prior art NAND type mask programmable read only memory device.
Figure 2:
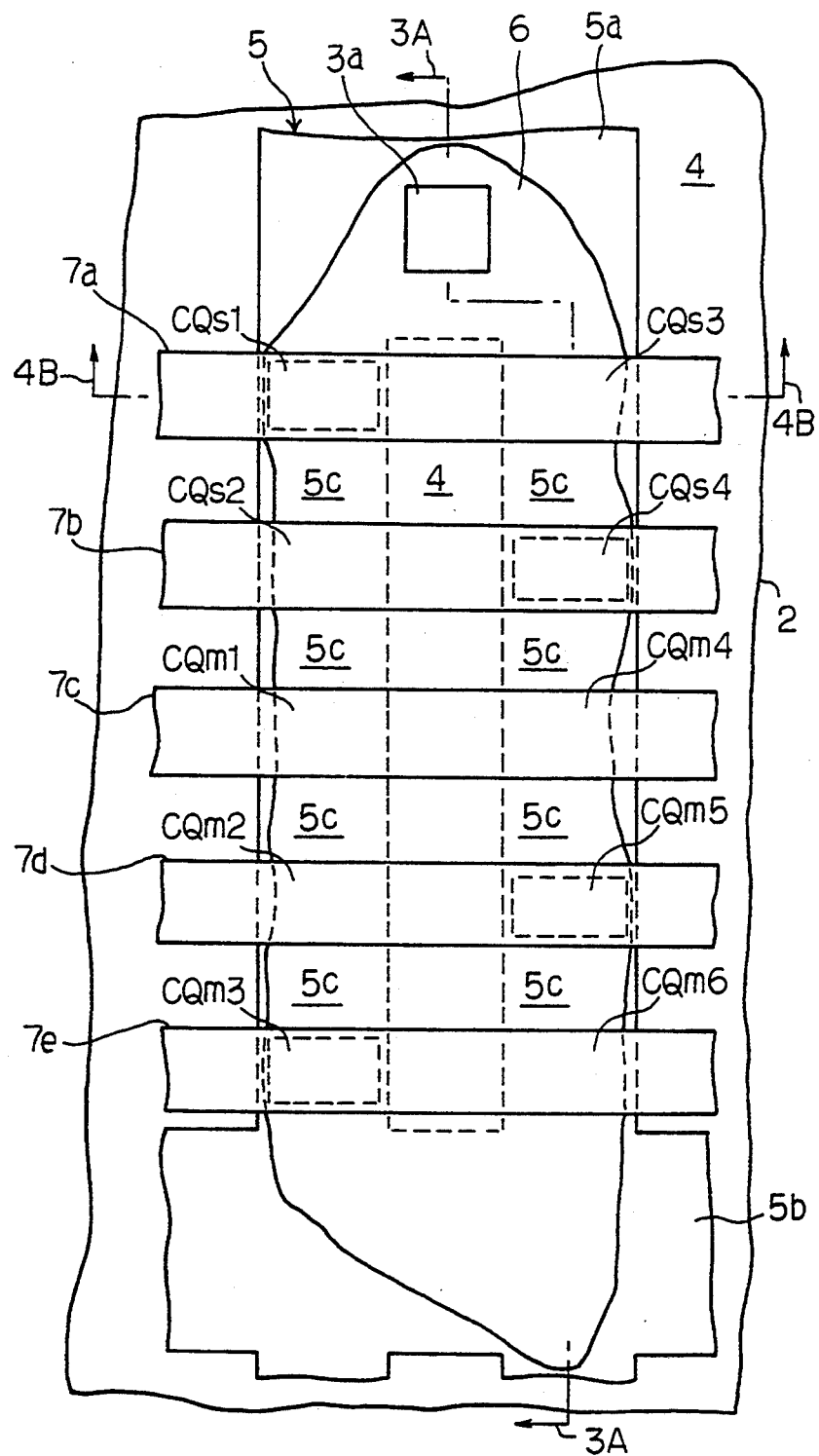
FIG. 2 is a plan view showing the layout of the prior art NAND type mask programmable read only memory device.
Figure 3:
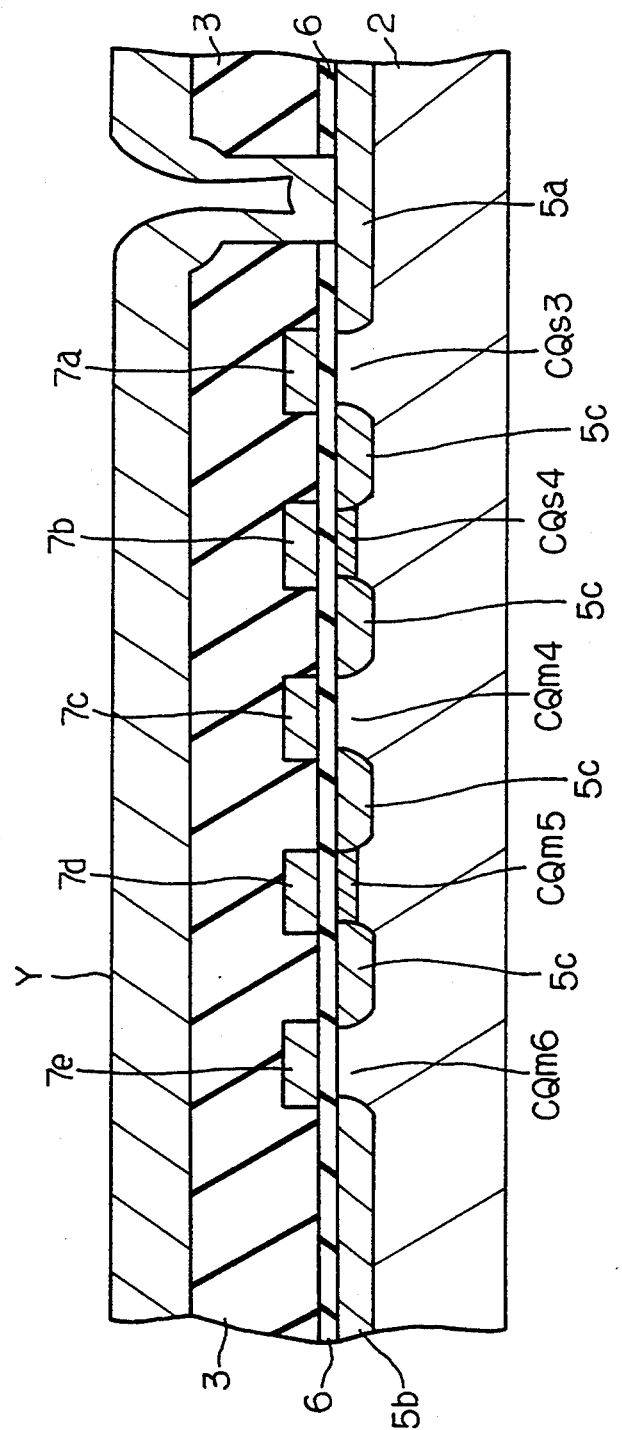
FIG. 3 is a cross sectional view taken along line A—A of FIG. 2 and showing the structure of the prior art NAND type mask programmable read only memory device.
Figure 4:
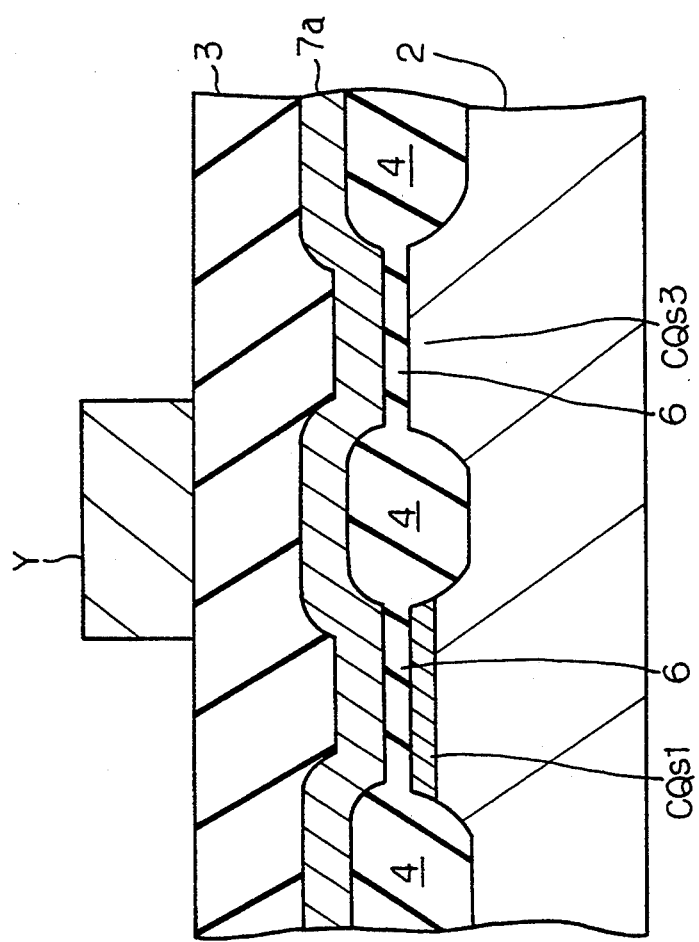
FIG. 4 is a cross sectional view taken along line B—B of FIG. 2 and also showing the structure from a different angle.
Figure 5:
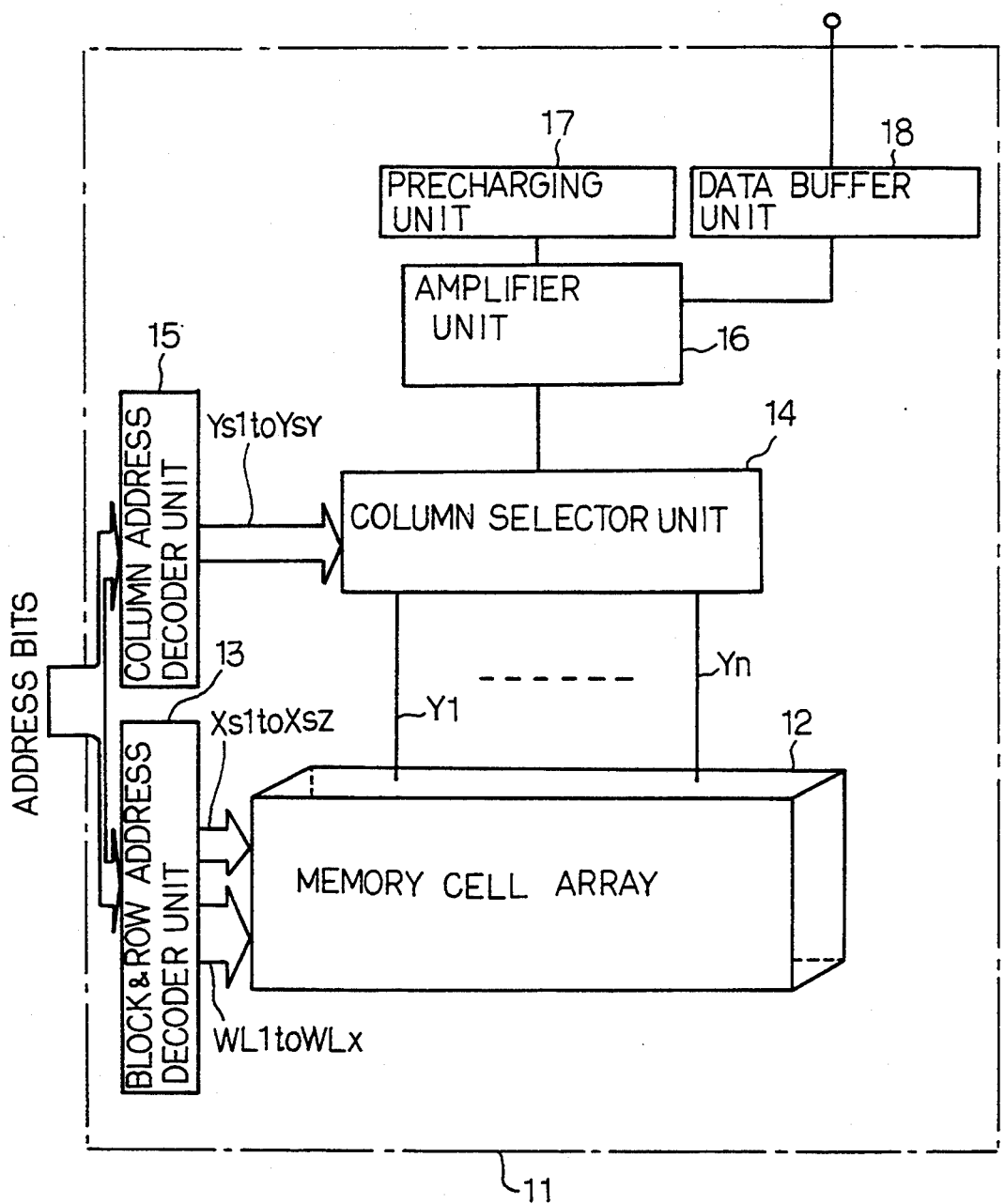
FIG. 5 is a block diagram showing the arrangement of a NAND type mask programmable read only memory device according to the present invention.

Referring to FIG. 5 of the drawings, a NAND type mask programmable read only memory device embodying the present invention is fabricated on a p-type silicon substrate 11, and comprises a memory cell array 12 three-dimensionally constructed, a block and row address decoder unit 13, a column selector unit 14 associated with a column decoder unit 15, an amplifier unit 16 associated with a precharging unit 17, and a data buffer unit 18.

The memory cell array 12 is implemented by a plurality of memory blocks each broken down into four memory sub-blocks as will be described hereinlater, and the memory blocks are arranged in rows and columns. Each of the memory blocks has a plurality memory cells, and the memory cells respectively store a plurality of data bits in non-volatile manner. A memory cell storing a data bit of logic "0" provides a current path, and no current path takes place in a memory cell storing a data bit of logic "1" when the data bit is accessed. The memory cell array 12 is associated with a plurality of block selecting lines Xs1 to Xsz, and the block selecting lines Xs1 to Xsz are used for selecting one of the plurality of memory blocks from each column. The memory cell array 12 is further associated with a plurality of word lines WL1 to WLx, and the word lines WL1 to WLx select one of the memory cells from each of the selected memory blocks in cooperation with the block selecting lines Xs1 ho Xsz. The memory cell array 12 is further associated with a plurality of bit lines Y1 to Yn, and the plurality of bit lines Y1 to Yn are assigned to the rows of the memory blocks, respectively. Therefore, when the block selecting lines Xs1 to Xsz and the word lines WL1 to WLx select one of the memory cells from each column, a data bit stored therein is read out to the associated bit line, and the bit lines Y1 to Yn propagate data bits read out from the memory cell array 12 to the column selector unit 14.

The block and row address decoder unit 13 is responsive to address bits indicative of block and row addresses, and selectively drives the block selecting lines Xs1 to Xsz as well as the word lines WL1 to WLx. Therefore, the block and row address decoder unit 13 allows data bits to be read out from the selected memory cells to the bit lines Y1 to Yn, respectively. The column address decoder unit 15 is also responsive to address bits indicative of a column address, and selectively drives column selecting lines Ys1 to Ysy. The column selecting lines Ys1 to Ysy are coupled with the column selector unit 14, and allows the column selector unit 14 to couple one of the bit lines Y1 to Yn with the amplifier unit 16. The precharging unit 17 supplies current to the selected memory cell, and the amplifier unit 16 monitors the voltage level on the selected bit line to see whether or not the selected memory cell provides a current path from the selected bit line to a source line S. If the voltage level on the selected bit line is decayed, the amplifier unit 16 determines the accessed data bit to be logic "0", and supplies an output data bit of logic "0" level to the data buffer unit 18. On the other hand, if the selected memory cell keeps the voltage level on the selected bit line, the amplifier unit 16 determines the accessed data bit to be logic "1", and supplies an output data bit of logic "1" level to the data buffer unit 18.

Figure 6:
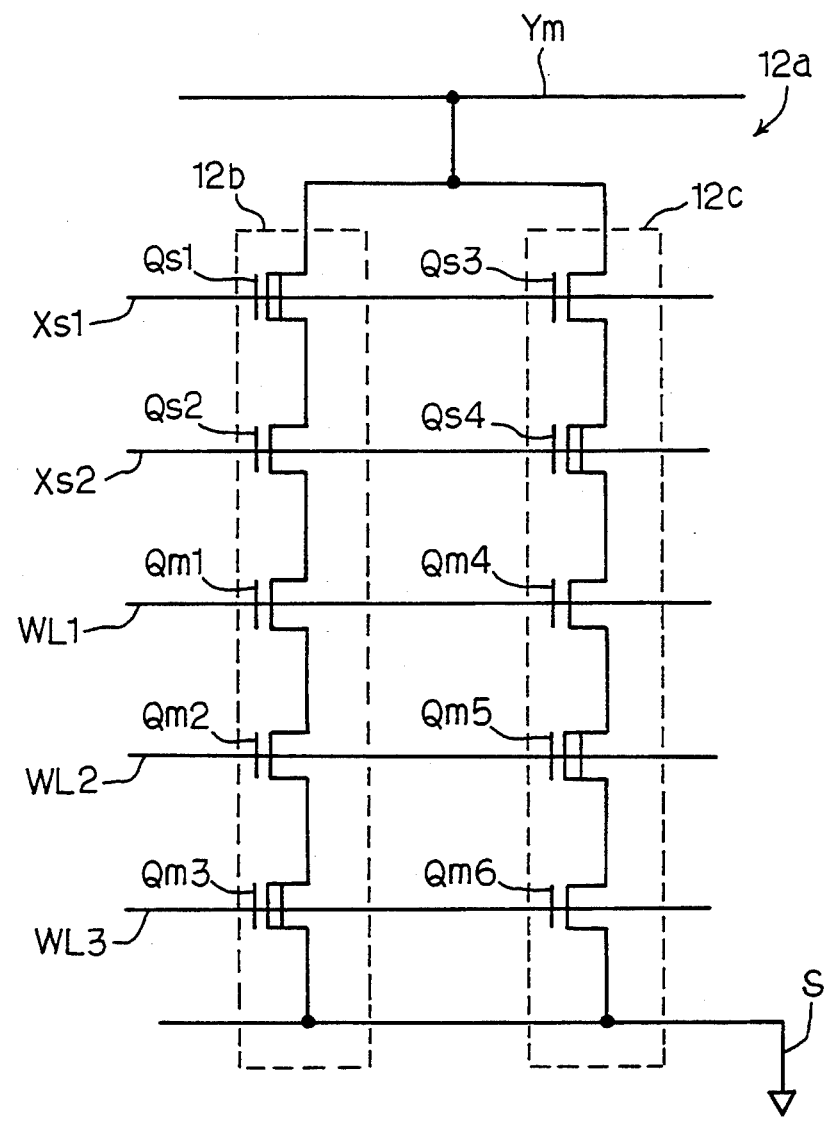
FIG. 6 is a circuit diagram showing the arrangement of a part of the memory cell array incorporated in the NAND type mask programmable read only memory device shown in FIG. 5.

One of the memory blocks 12a is illustrated in FIG. 6, and is associated with one of the bit lines Ym. The memory block 12a is broken down into memory sub-blocks 12b, and 12c, and block selecting lines Xs1 and Xs2 and word lines WL1, WL2 and WL3 are associated with the memory block 12a. The other memory blocks are similar in circuit arrangement to the memory block 12a, and no further description is incorporated hereinbelow.

The memory sub-blocks 12b and 12c are implemented by series combinations of n-channel type switching transistors Qs1/ Qs2 Qs3 and Qs4 as well as n-channel type memory transistors Qm1/Qm2/Qm3 and Qm4/Qm5/Qm6, and the series combinations are coupled between the associated bit line Ym and the source line S. The block selecting lines Xs1 and Xs2 are coupled with the gate electrodes of the n-channel type switching transistors Qs1 to Qs4, and allow one of the memory sub-blocks 12b and 12c to be coupled with the associated bit line Ym. Namely, each of the n-channel type switching transistors Qs1 to Qs4 is operative in either enhancement or depletion mode, and the depletion mode is established in the switching transistors Qs1 and Qs4. In order to select one of the memory blocks 12b and 12c, one of the block selecting lines Xs1 and Xs2 remains in low or the ground voltage level, and the other of the block selecting lines Xs1 and Xs2 is driven to positive high voltage level of about 5 volts. The n-channel type switching transistors applied with the positive high voltage level serve as transfer gates. If the n-channel type switching transistor applied with the low voltage level is operative in the depletion mode, the associated memory sub-block is coupled with the bit line Ym, and is selected from the memory block 12a. However, if the n-channel type switching transistor applied with the low voltage level is operative in the enhancement mode, the associated memory sub-block is isolated from the associated bit line Ym, and the memory sub-block is not accessible.

Each of the n-channel type memory transistors Qm1 to Qm6 is also operative in either enhancement or depletion mode, and the word lines WL1 to WL3 are selectively coupled with the n-channel type memory transistors Qm1 to Qm6. The word lines WL1 to WL3 are also selectively driven to the positive high voltage level, and one of the word lines WL1 to WL3 is left in the ground voltage level. The n-channel type memory transistors Qm1 to Qm6 applied with the positive high voltage level serve as transfer gates, and the n-channel type memory transistor in the selected memory sub-block applied with the low voltage level either provides or blocks a current path from the associated bit line Ym and the source line S depending upon the operation mode established therein. Namely, if the n-channel type memory transistor in the selected memory sub-block is operative in the depletion mode, current flows from the associated bit line Ym through the selected memory sub-block to the source line S, and the n-channel type memory transistor allows the associated bit line Ym to be decayed. However, if the n-channel type memory transistor in the selected memory sub-block is operative in the enhancement mode, no conductive channel is provided therein, and current never flows from the associated bit line Ym into the source line S. For this reason, the n-channel type memory transistor keeps the associated bit line without voltage decay, and the voltage level on the associated bit line Ym is determined by the operation mode established in the selected n-channel type memory transistor. Thus, the n-channel type enhancement mode memory transistor provides a data bit of logic "1" level on the associated bit line Ym, and the enhancement mode corresponds to the data bit of logic "1". On the other hand, the n-channel type depletion mode memory transistor provides a data bit of logic "0" level on the associated bit line Ym, and the depletion mode is representative of the data bit of logic "0" level.

In this instance, the word lines WL1 to WL3 are shared between the n-channel type memory transistors Qm1 to Qm3 and the n-channel type memory transistors Qm4 to Qm6, and the memory sub-block 12c is overlapped with the memory sub-block 12b. As will be described hereinlater, the n-channel type switching transistors Qs3 and Qs4 and the n-channel type memory transistors Qm4 to Qm6 are formed in a major surface of the p-type silicon substrate 11 as bulk transistors, and the n-channel type switching transistors Qs1 and Qs2 and the n-channel type memory transistors Qm1 to Qm3 are respectively formed as thin-film transistors over the n-channel type switching transistors Qs3 and Qs4 and the n-channel type memory transistors Qm4 to Qm6.

Figure 7:
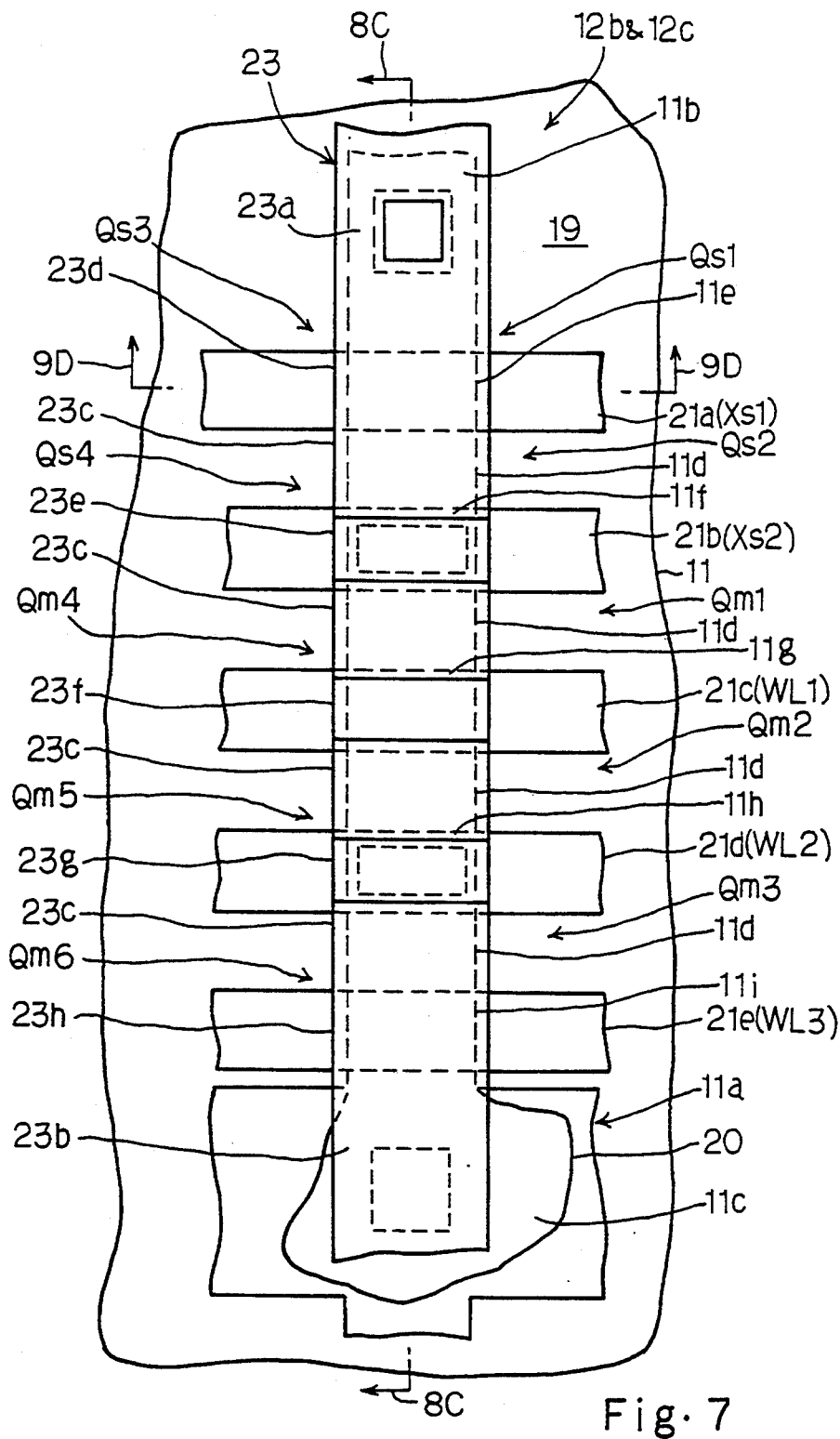
FIG. 7 is a plan view showing a part of the layout of the NAND type mask programmable read only memory device shown in FIG. 5.
Figure 8:
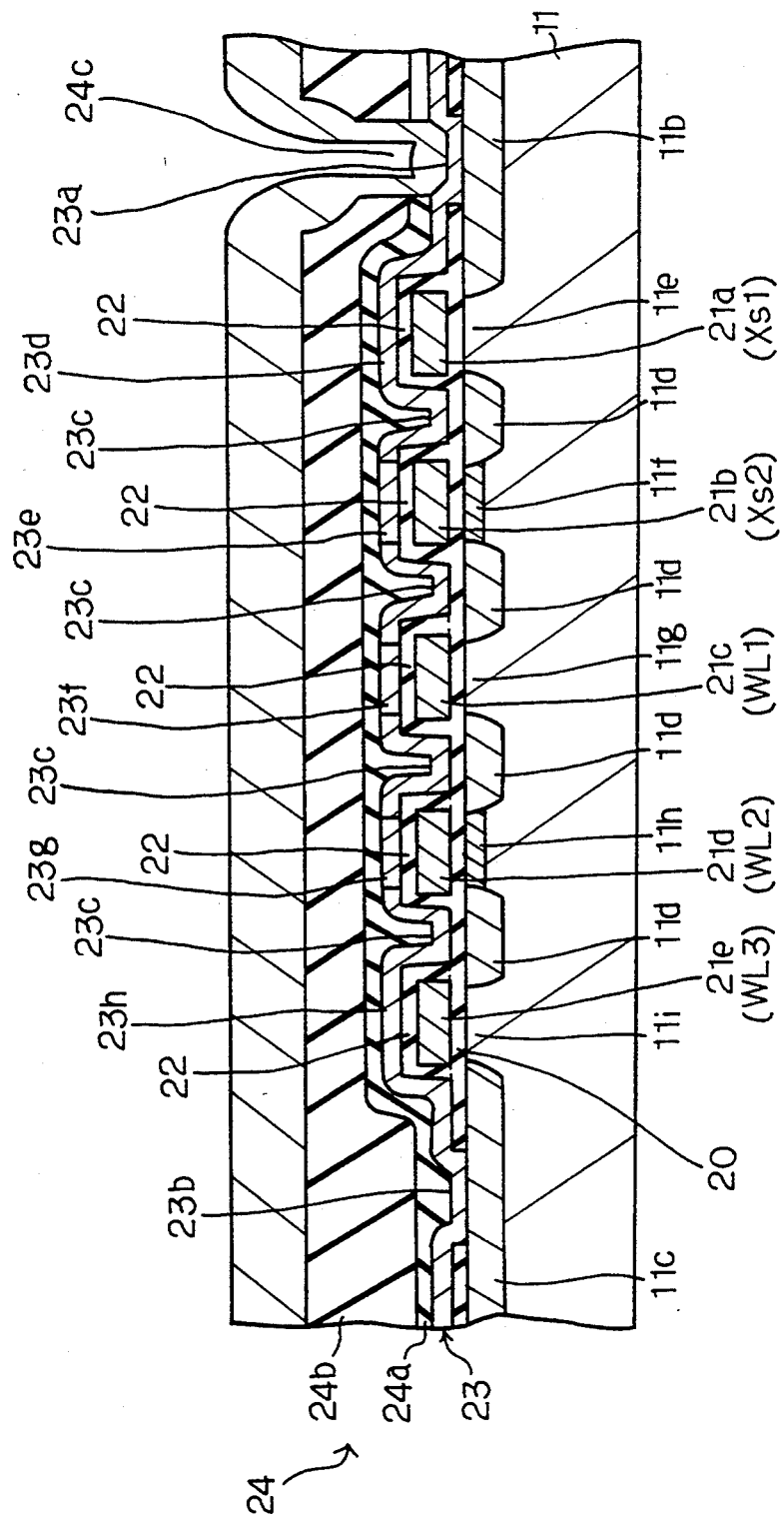
FIG. 8 is a cross sectional view taken along line C—C and showing the structure of the NAND type mask programmable read only memory device.
Figure 9:
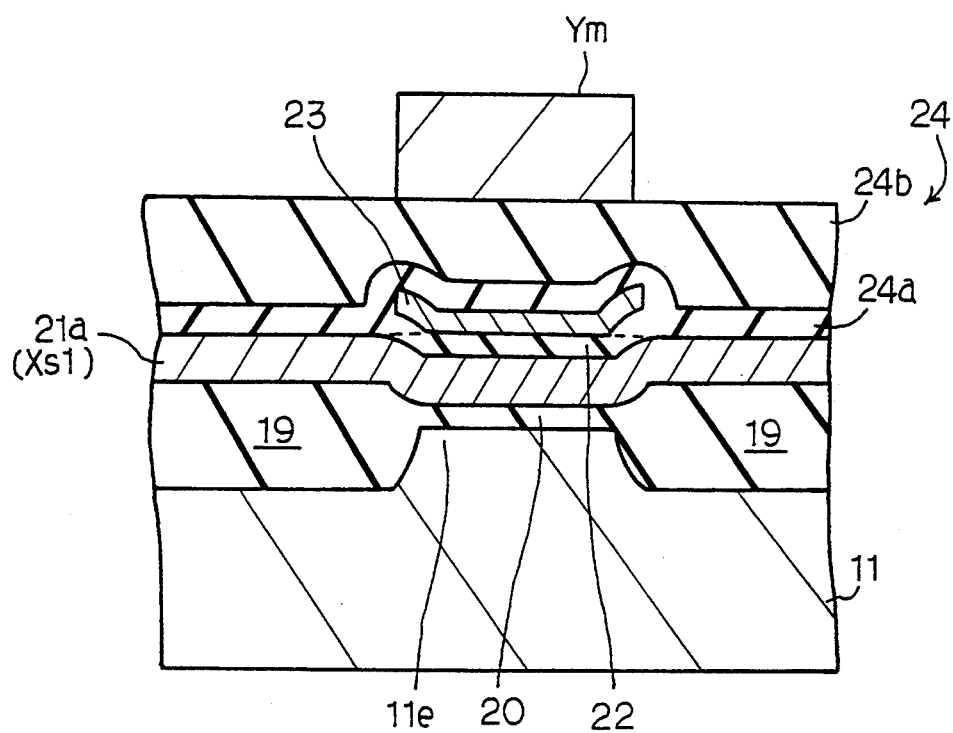
FIG. 9 is a cross sectional view taken along line D—D and showing the structure from a different angle.

Turing to FIGS. 7 to 9 of the drawings, the layout and the structure of the memory sub-blocks 12b and 12c are illustrated in detail. The p-type silicon substrate 11 is doped at about $4 \times 10^{16}$ cm$^{-3}$, and a thick field insulating film 19 is selectively grown on the major surface of the p-type silicon substrate 11. The thick field insulating film 19 is as thick as about 6000 angstroms, and defines an active area 11a in the major surface of the p-type silicon substrate 11. The active area 11a is covered with a first gate oxide film 20 which is as thin as about 250 angstroms. The active area 11a provides a common drain region 11b of the memory sub-blocks 12b and 12c, a common source region 11c of the memory sub-blocks 12b and 12c, source/drain regions 11d for the n-channel type switching transistors Qs3 and Qs4 and the n-channel type memory transistors Qm4 to Qm6 and channel regions 11e to 11i for the n-channel type switching transistors Qs3 and Qs4 and the n-channel type memory transistors Qm4 to Qm6. The common drain region 11b, the common source region 11c and the source/drain regions 11d are doped with arsenic atoms at about $5 \times 10^{20}$ cm$^{-3}$ and the channel regions 11e to 11i are selectively doped with n-type impurities at about $1 \times 10^{17}$ cm$^{-3}$, thereby providing doped channels 11f and 11h for the n-channel type transistors Qs4 and Qm5. Doped polysilicon strips 21a to 21e extend on the first gate oxide film 20 over the channel regions 11e to 11i, respectively, and serve as the block selecting lines Xs1 and Xs2 and the word lines WL1, WL2 and WL3 and partially as the gate electrodes of the n-channel type switching transistors Qs1 to Qs4 and the gate electrodes of the n-channel type memory transistors Qs1 to Qs6.

The doped polysilicon strips 21a to 21e are covered with a second gate oxide film 22, and the second gate oxide film 22 is grown through a high-temperature vapor-phase growing process. The second gate oxide film 22 is as thin as about 300 angstroms, and is merged into the first gate oxide film 20 so that the doped polysilicon strips 21a to 21e are wrapped into the first and second gate oxide films 20 and 22. However, the second gate oxide film 22 is removed from FIG. 7 for simplicity. On the second gate oxide film 22 extends a silicon film 23 which is formed through a growing process of amorphous silicon followed by doping with boron at $1 \times 10^{16}$ cm$^{-3}$. The silicon film 23 is as thick as about 500 angstroms, and is held in contact with the common drain region 11b and the common source region 11c through contact holes formed in the first gate oxide film 20. The silicon film 23 provides a common drain region 23a of the memory bus-block 23a, a common source region 23b of the memory sub-block 23b, source/drain regions 23c for the n-channel type switching transistors Qs1 and Qs2 and the n-channel type switching transistors Qm1 to Qm3 and channel regions 23d, 23e, 23f, 23g and 23h for the n-channel type switching transistors Qs1 and Qs2 and the n-channel type memory transistors Qm1 to Qm3. In this instance, the channel doping for the depletion mode transistors is simultaneously carried out together with the source/drain regions 23c, and the heavily doped silicon strip 23 per se serves as the Channel regions 23d and 23h substantially equal in impurity concentration to the source/drain regions 23c.

The silicon film 23 is covered with an inter-level insulating film structure 24 implemented by a silicon dioxide film 24a and a boron phospho-silicate glass film 24b, and a contact hole 24c is formed in the inter-level insulating film structure 24. The bit line Ym of aluminum extends on the inter-level insulating film structure 24, and is as thick as about 9000 angstroms. The bit line Ym passes through the contact hole 24c, and is held in contact with the common drain region 23a of the silicon film 23 and, accordingly, with the common drain region 11b.

Thus, the memory cell array 12 incorporated in the mask programmable read only memory device thus arranged is constructed in the three-dimensional structure, and merely occupies a half of the real estate in comparison with the two-dimensional memory cell array incorporated in the prior art mask programmable read only memory device.

Description is hereinbelow made on a process sequence for fabricating the mask programmable read only memory device according to the present invention with reference to FIGS. 10A to 10C. The process sequence starts with preparation of the p-type silicon substrate 11, and the thick field insulating film 19 is selectively grown in the major surface of the p-type silicon substrate 11 through a selective oxidation technique such as, for example, a LOCOS process. The first thin gate oxide film 20 is thermally grown over the active area 23, and polysilicon is deposited over the entire surface of the structure. The polysilicon film is patterned by using lithographic techniques, and the polysilicon strips 21a to 21e are formed on the first gate oxide film 20. However, any channel doping has not been carried out, yet. The resultant structure of this stage is illustrated in FIG. 10A.

Figure 10A:
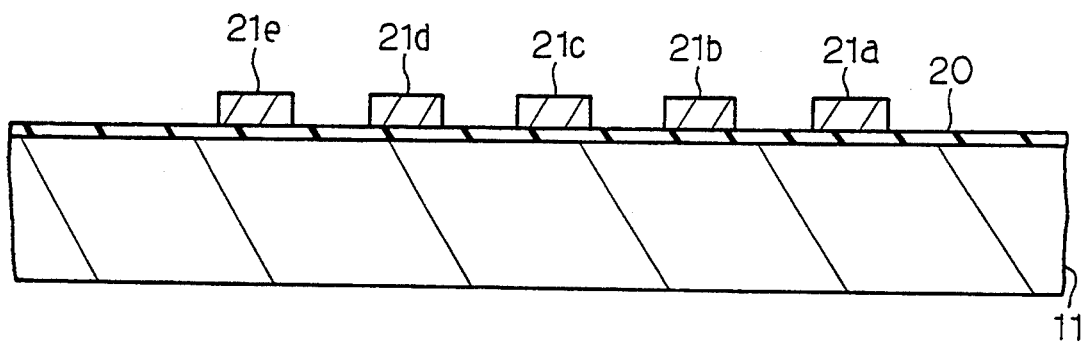
FIGS. 10A to 10E are cross sectional views showing a process sequence for fabricating the mask programmable read only memory device shown in FIG. 7.
Figure 10B:
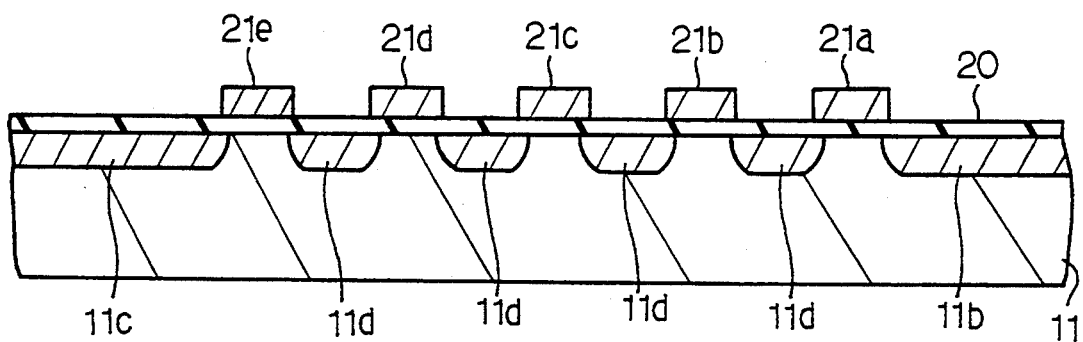
Figure 10C:
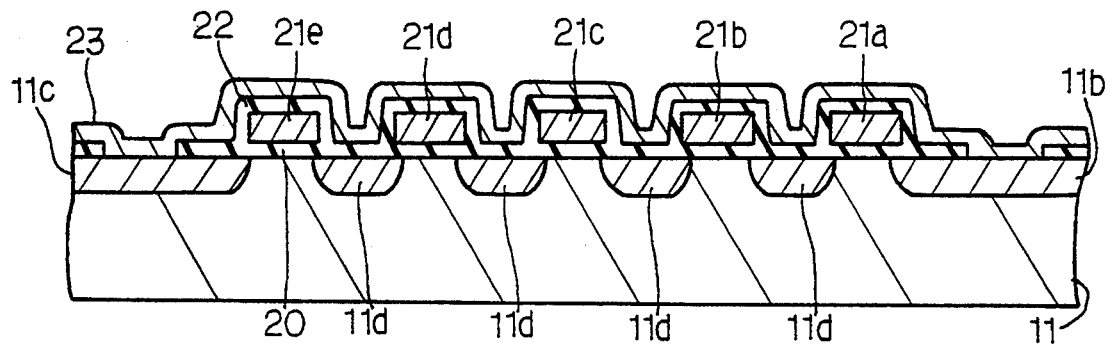

Using the polysilicon strips 21a to 21e as a mask, n-type impurity atoms are ion-implanted into the p-type silicon substrate 11, and the common drain region 11b, the common source region 11c and the source and drain regions 11d are formed in the active area 11a as will be seen from FIG. 10A.

The second gate oxide film 22 is grown on the polysilicon strips 21a to 21e, and the contact holes are formed in the first gate oxide film 20, thereby exposing the common drain region 11b and the common source region 11c. Amorphous silicon is deposited over the entire surface of the structure, and boron is doped into the amorphous silicon film. After the doping, annealing is carried out so that the amorphous silicon film is crystallized. The silicon film 23 thus formed from the amorphous silicon film is of the p-type, and is patterned by using appropriate lithographic techniques, and is held in contact with the common drain region 11b and the common source region 11c through the contact holes formed in the first gate oxide film 20. The resultant structure of this stage is shown in FIG. 10C, and is stocked by the manufacture until receipt of an order for a mask programmable read only memory device.

Figure 10D:
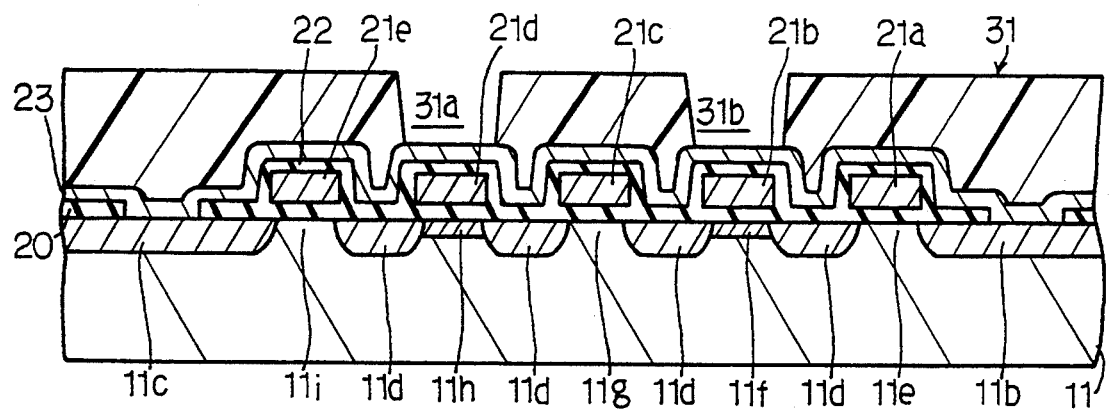

If the manufacturer receives an order for a mask programmable read only memory device together with a design specification, the manufacturer programs the memory cell array 12, and completes the mask programmable read only memory device. In detail, photo-resist solution is spun onto the structure as shown in FIG. 10C for forming a photo-resist film of about 1.5 microns, and the photo-resist film is patterned through lithographic process, thereby being formed into a first photo mask film 31. The first photo mask film 31 has through holes 31a and 31b exposing first predetermined parts of the silicon film 23 over the polysilicon strips 21b and 21d, i.e., the gate electrode of the n-channel type switching transistor Qs4 and the gate electrode of the n-channel type memory transistor Qm5. Phosphorus atoms are ion-implanted at dose of $2 \times 10^{13}$ cm$^{-2}$ under acceleration energy of 500 KeV, and the phosphorus atoms penetrate into the channel regions 11f and 11h. Thus, the channel regions 11f and 11h are doped with n-type impurity atoms, and allow the n-channel type switching transistor Qs4 and the n-channel type memory transistor Qm5 to operate in the depletion mode. However, the silicon film 23 is transparent to the phosphorus atoms, and is kept in the p-type. The resultant structure of this stage is illustrated in FIG. 10D.

Figure 10E:
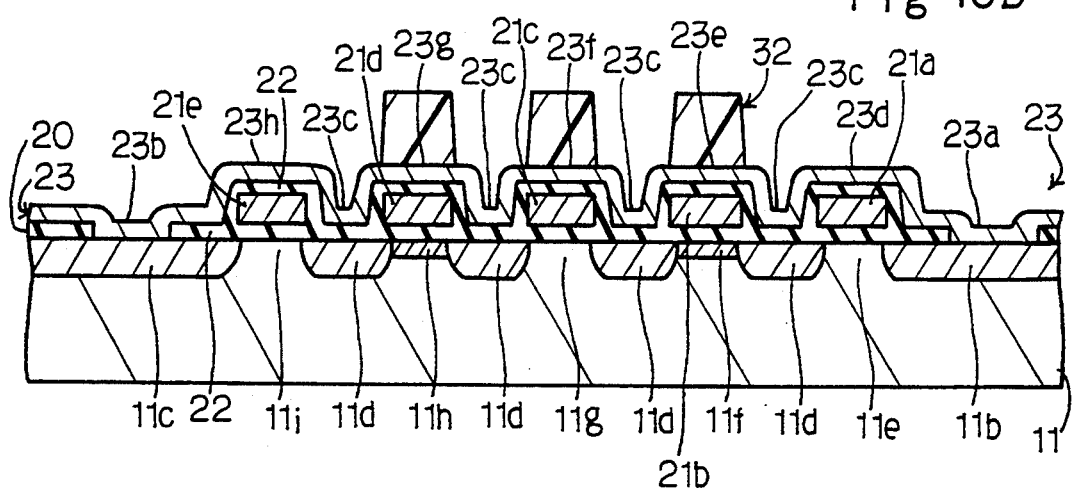

The first photo mask film 31 is then stripped off, and photo-resist solution is spun onto the entire structure again. The photo-resist solution results in a photo-resist film, and the photo-resist film is patterned into a second photo mask film 32. The photo mask film 32 covers predetermined parts of the silicon film 23 over the polysilicon strips 21b, 21c and 21d, and has through holes exposing the other silicon film 23. Arsenic atoms are ion-implanted into the other silicon film 23 at dose of about $5 \times 10^{15}$ cm$^{-2}$ under acceleration energy of 30 KeV, and the arsenic atoms hardly penetrate the silicon film 23 under such a low acceleration energy. Then, the exposed silicon film 23 is doped with n-type impurity atoms, and the exposed silicon film 23 provides the common drain region 23a, the common source region 23b, the source/drain regions 23c and the doped channel regions 23d and 23h. However, the second photo mask film 32 prevents the channel regions 23e, 23f and 23g from the arsenic atoms, and are kept in the p-type. Thus, not only the lower memory sub-block 12c but also the upper memory sub-block 12b are programmed after formation of the silicon film 23 by changing the acceleration energy. The resultant structure of this stage is illustrated in FIG. 10E.

After the completion of the n-channel type switching transistors Qs1 to Qs4 and the n-channel type memory transistors Qm1 to Qm6, the inter-level insulating film structure 24 are formed, and the bit line Ym is brought into contact with the common source and drain regions 11b/23a and 11c/23b as described hereinbefore in connection with FIG. 8.

Second Embodiment

Turning to FIGS. 11A to 11D of the drawings, another process sequence is illustrated. Early stages of the process sequence implementing the second embodiment are similar to those shown in FIGS. 10A to 10C, and FIGS. 11A and 11B correspond to FIGS. 10C and 10D, respectively. Films and regions of the second embodiment are labeled with the same references designating the corresponding films and regions of mask programmable read only memory device implementing the first embodiment. In detail, after formation of the second gate oxide film 22, the silicon film 23 is formed over the second gate oxide film 22, and extends over the polysilicon strips 21a to 21e so as to be held in contact with the common drain region 11b as well as with the common source region 11c as will be seen from FIG. 11A.

Figure 11A:
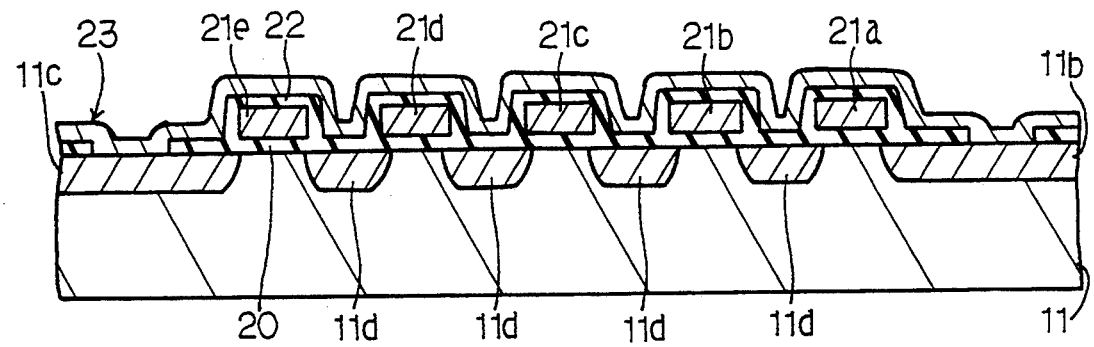
FIGS. 11A to 11D are cross sectional views showing another process sequence applied to another mask programmable read only memory device according to the present invention.
Figure 11B:
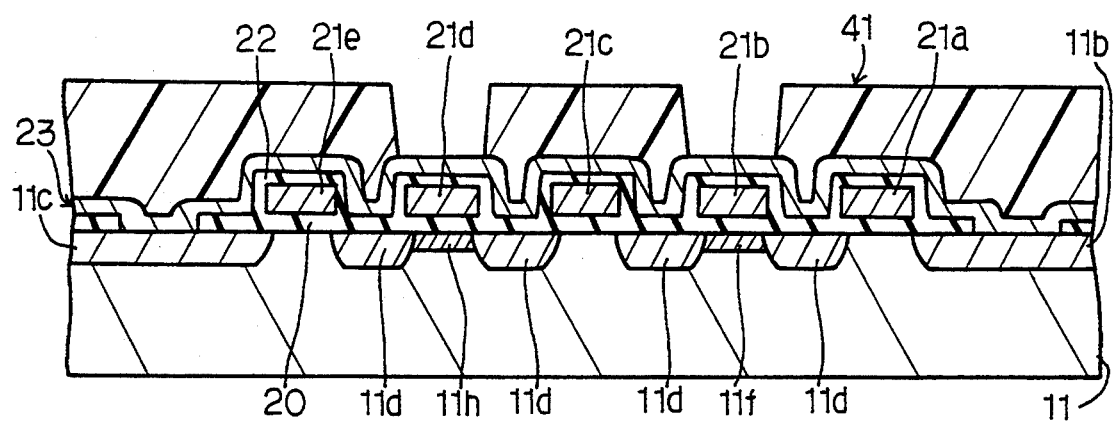

Photo-resist solution is spun onto the entire surface, and the photo-resist solution is patterned to form a photo resist mask 41. The photo resist mask 41 exposes the silicon film 23 over the polysilicon strips 21b and 21d, and cover the other silicon film 23 as shown in FIG. 11B. Ion implantation is carried out under large acceleration energy as similar to the first embodiment, and doped channel regions 11f and 11h take place between the source/drain regions 11d.

Figure 11C:
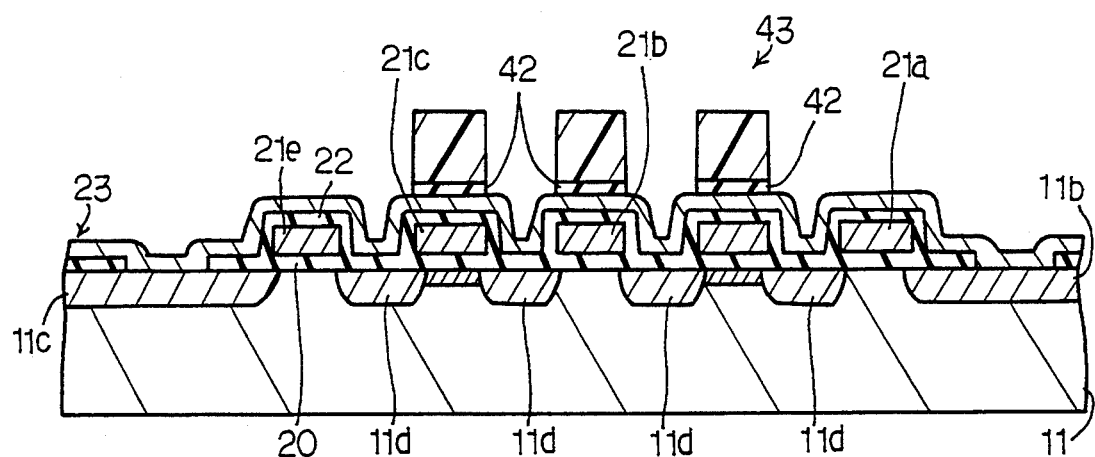
Figure 11D:
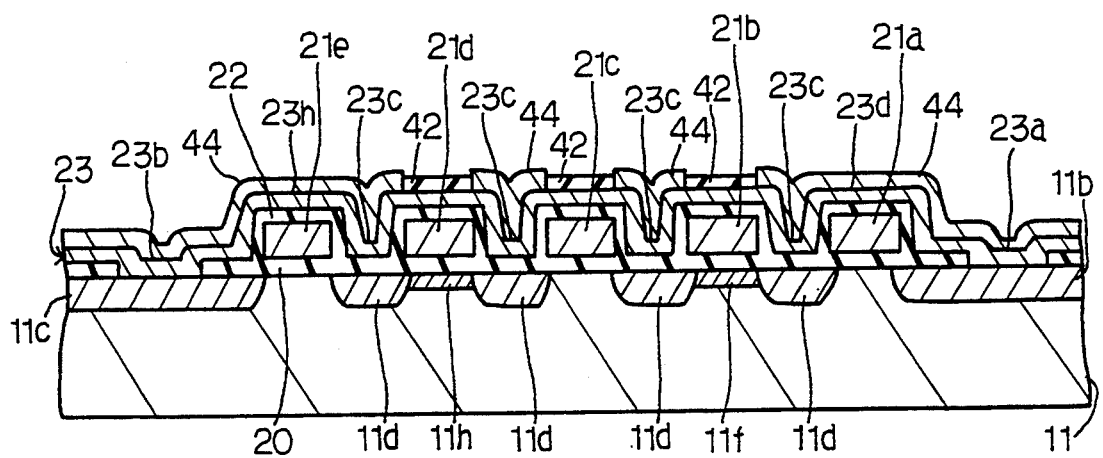

The photo resist mask 41 is stripped off, and silicon dioxide is deposited over the entire surface to thickness of about 2000 angstroms through a vapor phase deposition process so as to form a silicon dioxide film 42. Photo resist solution is spun onto the entire surface of the structure, and the photo resist film is patterned into a photo resist mask 43. The photo resist mask 43 covers the silicon dioxide film 42 over the polysilicon strips 21b to 21d, and exposes the other silicon dioxide film 42. Using the photo resist mask 43, the silicon dioxide film 42 is selectively etched away as shown in FIG. 11c, and ion implantation is carried out under small acceleration energy as similar to the first embodiment. Then, the doped channel regions 23d and 23h, the common source and drain regions 23a and 23b and the source/drain regions 23c take place in the silicon film 23.

The photo resist mask 43 is stripped off, and titanium is sputtered to thickness of 1000 angstroms. Heat treatment at about 800 degrees in centigrade is carried out to form a titanium silicide film 44 from the titanium film held in contact with the silicon film 23. After the formation of the titanium silicide film 44, residual titanium film is removed in solution of NH$_4$ and H$_2$—O$_2$. Finally, boron phospho-silicate glass film (not shown) is deposited over the entire surface to thickness of about 8000 angstroms, and is, thereafter, annealed. A contact hole is formed in the boron phospho-silicate glass film, and a bit line (not shown) on the boron phospho-silicate glass film is brought into contact with the common source region 11b.

The silicon dioxide film 42 allows the inter-level insulating film to be implemented by only the boron phospho-silicate glass, and the titanium silicide film decreases resistance along the second-level memory sub-block. In general, an enhancement mode thin film transistor is increased in transconductance with decreasing the thickness of the silicon film. However, the thin silicon film increases parasitic capacitance coupled with the source/drain regions thereof, and, accordingly, decreases the amount of current passing therethrough. However, the mask programmable read only memory device implementing the second embodiment has the thin film transistors implemented by the titanium silicide film, and the silicide film is free from the parasitic capacitance. For this reason, the thin film transistors can achieve large transconductance without sacrifice of the amount of current passing therethrough.

Third Embodiment

Figure 12:
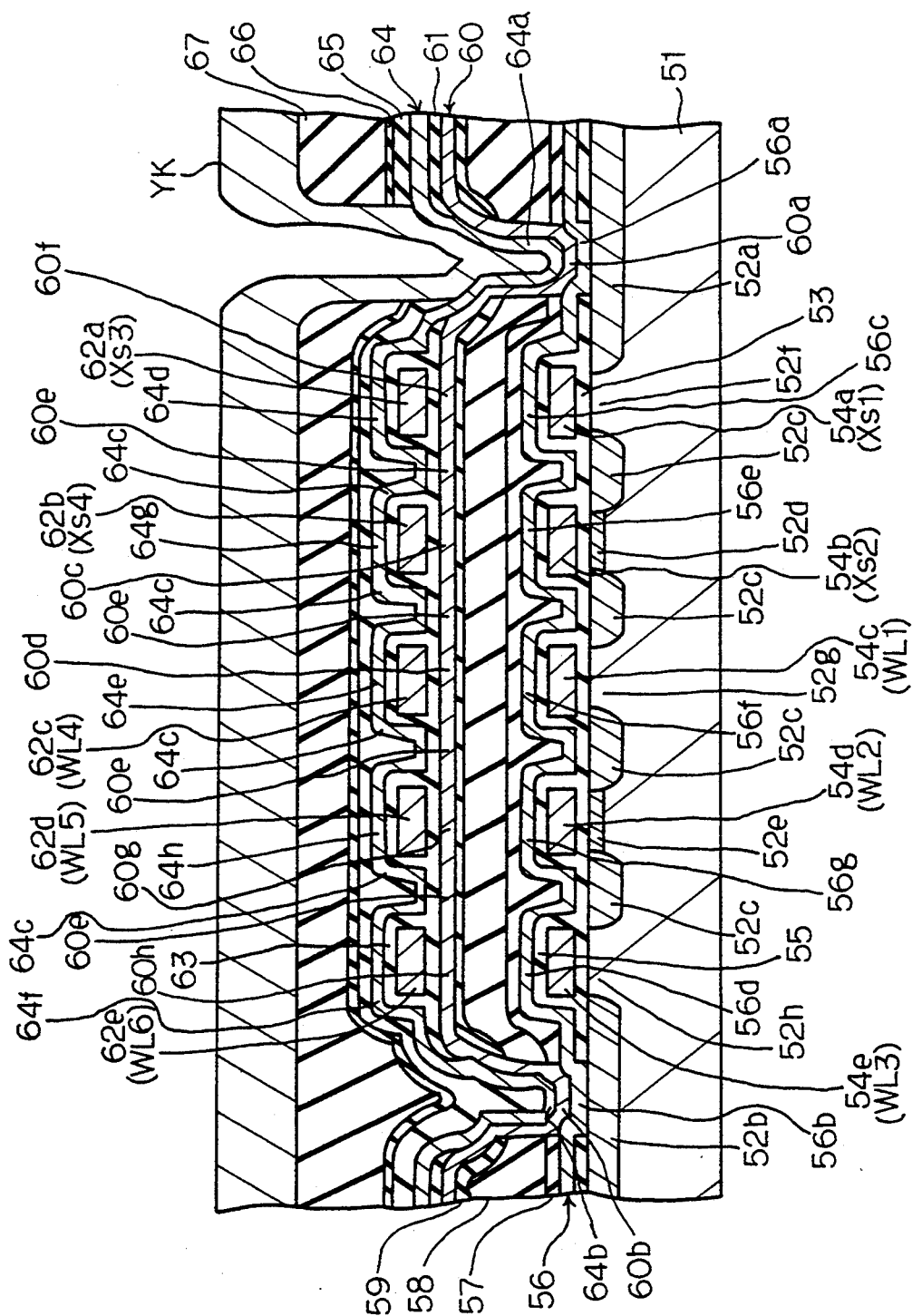
FIG. 12 is a cross sectional view showing the structure of yet another mask programmable read only memory device according to the present invention.

Turning to FIG. 12 of the drawings, yet another mask programmable read only memory device embodying the present invention is fabricated on a p-type silicon substrate 51. The mask programmable read only memory device implementing the third embodiment has a memory cell array arranged in four-levels.

A common source region 52a, a common drain region 52b, source/drain regions 52c, n-type doped channel regions 52d and 52e and non-doped channel regions 52f, 52g and 52h are formed in the major surface regions of the p-type silicon substrate 51, and a first gate oxide film 53 covers the major surface of the p-type silicon substrate 51. Polysilicon strips 54a to 54e extends on the first gate oxide film 53, and are covered with a second gate oxide film 55. The common source region 52a, the common drain region 52b, the source/drain regions 52c, the n-type doped channel regions 52d and 52e, the non-doped channel regions 52f to 52h, the first gate oxide film 53, the polysilicon strips 54a to 54e form in combination a first-level memory sub-block implemented by a series combination of n-channel type switching transistors and n-channel type memory transistors each operative in either enhancement or depletion mode.

On the second gate oxide film 55 extends a first silicon film 56 which is crystalized from an amolphus silicon film through a laser annealing. The first silicon film 56 is doped with boron at $2 \times 10^{16}$ cm$^{-3}$, and contact areas 56a and 56b of the first silicon film 56 are respectively held in contact with the common drain region 52a and the common source region 52b through contact holes formed in the first gate oxide film 53. The contact areas 56a and 56b are doped with phosphorus atoms at dose of $5 \times 10^{14}$ cm$^{-2}$ as well as with arsenic atoms at dose of about $5 \times 10^{15}$ cm$^{-2}$, and heat treatment is carried out for the contact areas 56a and 56b after the doping stage. Doped channels 56c and 56d are formed in the first silicon film 56 for depletion mode transistors, and are doped with phosphorus atoms at $1 \times 10^{16}$ cm$^{-2}$. Non-doped channel regions 56e, 56f and 56g are formed in the first silicon film 56, and form parts of enhancement mode transistors. The polysilicon strips 54a to 54e, the second gate oxide film 55 and the first silicon film 56 form in combination a second-level memory sub-block implemented by a series combination of n-channel type switching transistors and n-channel type memory transistors each operative in either enhancement or depletion mode.

The second-level memory sub-block is covered with a silicon dioxide film 57 deposited to thickness of 1000 angstroms through a vapor-phase deposition process, and the silicon dioxide film 57 is overlain by a boron phosphosilicate glass film 58 as thick as about 6000 angstroms. The boron phospho-silicate glass film 58 is covered with a silicon oxide film 59 deposited to thickness of about 1000 angstroms through a low-temperature vapor-phase deposition process. The silicon dioxide films 57 and 59 and the boron phospho-silicate glass film 58 form in combination a first inter-level insulating film structure.

On the first inter-level insulating film structure is formed a second silicon film 60 which is crystalized from an amolphus silicon film as similar to the first silicon film 56. The second silicon film 60 is initially doped with boron atoms, and is selectively doped with n-type impurity atoms so as to form contact areas 60a and 60b, doped channel regions 60c and 60d and source/drain regions 60e. However, non-doped channel regions 60f, 60g and 60h are left in the silicon film 60 for enhancement mode transistors. The doped channel regions 60c and 60d are as heavily in phosphorus concentration as $5 \times 10^{16}$ cm$^{-3}$. A third gate oxide film 61 covers the silicno film 60, and is as thin as 300 angstroms. Composite wiring lines 62a to 62e extend over the third gate oxide film 61 at spacings, and the composite wiring lines 62a to 62e serve as block selecting lines and word lines as similar to the polysilicon strips 54a to 54e. Each of the composite wiring lines 62a to 62e is implemented by a polysilicon strip of about 2000 angstroms thick overlain by a tungsten silicide film of about 1000 angstroms thick. The composite wirings 62a to 62e may be referred to as "polyside structure". The silicon film 60, the third gate oxide film 61 and the composite wirings 62a to 62e form in combination a series of n-channel switching transistors and n-channel memory transistors of a third-level memory sub-block each operative in either depletion or enhancement mode.

The composite wirings 62a to 62e are covered with a fourth gate oxide film 63 of about 300 angstroms thick, and the fourth gate oxide film 63 is deposited by using a high-temperature vapor-phase deposition technique. A third silicon film 64 is formed as similar to the first silicon film 56, and arsenic atoms are doped into the third silicon film 64 at $1 \times 10^{21}$ cm$^{-3}$ so as to form contact areas 64a and 64b, source/drain regions 64c and doped channel regions 64d, 64e and 64f. However, non-doped channel regions 64g and 64h are left in the third silicon film 64. The composite wirings 62a to 62e, the fourth gate oxide film 63 and the third silicon film 64 form in combination a fourth-level memory sub-block implemented by a series of n-channel type switching transistors and n-channel type memory transistors each operative in either depletion or enhancement mode.

The third silicon film 64 is covered with a silicon dioxide film 65 of about 1000 angstroms thick, and the silicon dioxide film 65 is deposited by using the low-temperature vapor-phase deposition process. Using a vapor phase deposition technique, a silicon nitride film 66 is deposited over the silicon dioxide film 65 which is about 200 angstroms thick. A boron phospho-silicate glass film 67 is deposited over the silicon nitride film 66 to thickness of about 4000 angstroms, and the silicon dioxide film 65, the silicon nitride film 66 and the boron phosphosilicate glass film 67 as a whole constitute a second inter-level insulating film structure. A deep contact hole is formed through the second inter-level insulating film structure, the third gate oxide film 61, the first inter-level insulating film structure and the first gate oxide film 53, and a bit line Yk of aluminum on the boron phospho-silicate glass film 67 is held in contact through the deep contact hole with the contact areas 64a, 60a and 56a and, accordingly, with the common drain region 52a.

Figure 13:
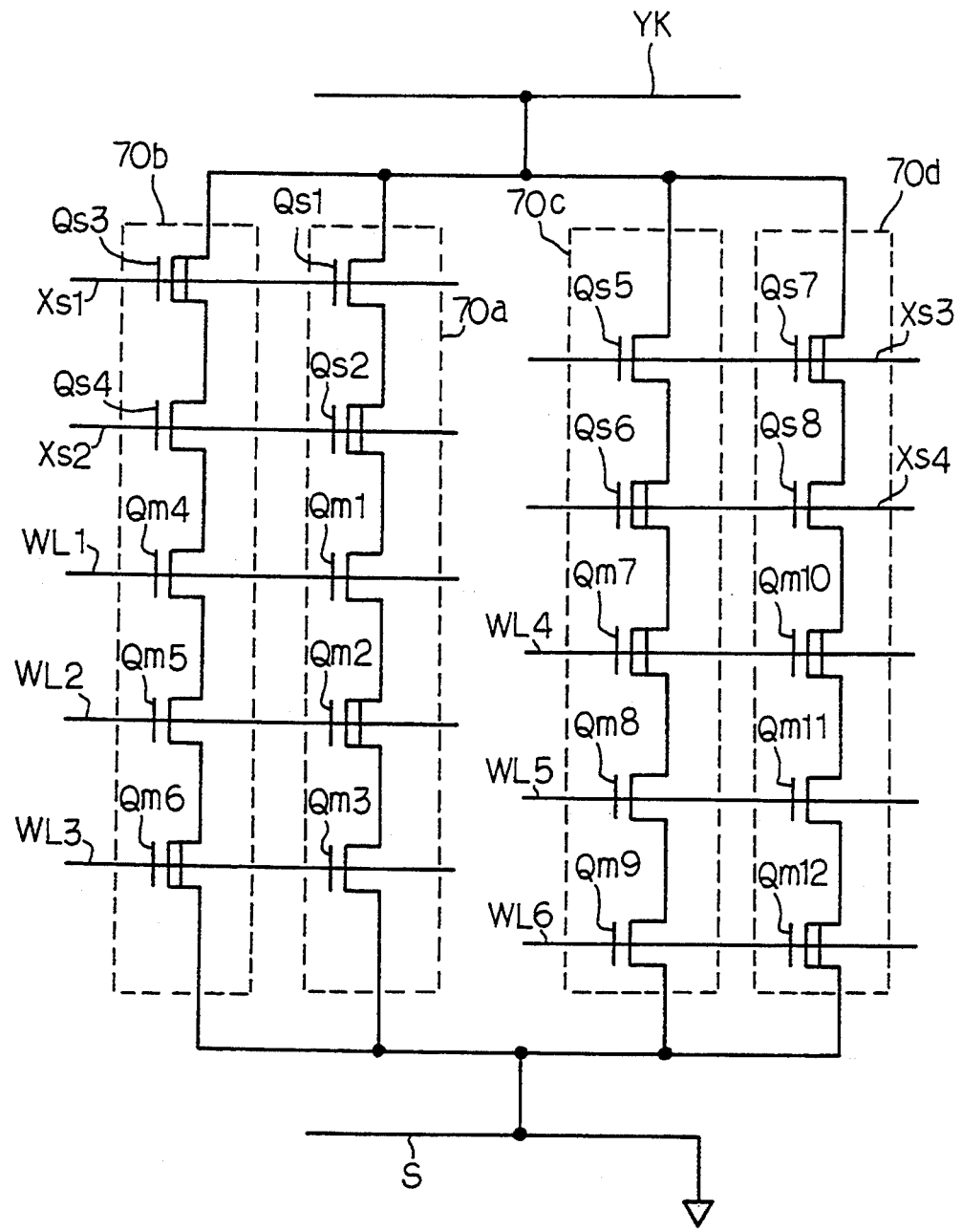
FIG. 13 is a circuit diagram showing the equivalent circuit of the memory sub-arrays shown in FIG. 12.

The memory block shown in FIG. 12 is broken down into the four memory sub-blocks 70a, 70b, 70c and 70d coupled between the bit line Yk and a source line S as shown in FIG. 13, and the memory sub-blocks respectively correspond to the first-level to the fourth-level memory sub-blocks. Each of the memory sub-block 70a and 70b is implemented by two n-channel type switching transistors Qs1/Qs2 or Qs3/Qs4 and three n-channel type memory transistors Qm1/Qm2/Qm3 or Qm4/Qm5/Qm6, and each of the memory sub-blocks 70c and 70d is implemented by two n-channel type switching transistors Qs5/Qs6 or Qs7/Qs8 and three n-channel type memory transistors Qm7/QmS/Qm9 or Qm10/Qm11/Qm12. The polysilicon strips 54a to 54e respectively serve as block selecting lines Xs1/Xs2 and word lines WL1 to WL3, and the block selecting lines Xs1/Xs2 and the word lines WL1 to WL3 are respectively shared between the n-channel type switching transistors Qs1/Qs2 and the n-channel type switching transistors Qs3/Qs4 and between the n-channel type memory transistors Qm1 to Qm3 and the n-channel type memory transistors Qm4 to Qm6. The composite lines 62a to 62e respectively serve as block selecting lines Xs3/Xs4 and word lines WL4 to WL6, and the block selecting lines Xs3/Xs4 and the word lines WL4 to WL6 are respectively shared between the n-channel type switching transistors Qs5/Qs6 and the n-channel type switching transistors Qs7/Qs8 and between the n-channel type memory transistors Qm7 to Qm9 and the n-channel type memory transistors Qm10 to Qm12. The memory block shown in FIG. 13 is accessible as similar to the memory block 12a, and no further description is incorporated hereinbelow for the sake of simplicity. The programming or coding of the four-level memory sub-blocks 70a to 70d are analogous from that of the first embodiment. Namely, after the formation of the third silicon film 64, the manufacturer interrupts the fabrication process until a customer supplies a programming list for the memory cell array. In the programming stage, the manufacturer provides a first mask layer over the third silicon film 64, and impurities are ion-implanted into the p-type silicon substrate 51 at extremely large acceleration energy for the doped channel regions 52d and 52e. After removing the first mask layer, a second mask layer is provided over the third silicon film 64, and impurities are ion-implanted into the first silicon film 56 under large acceleration energy for the doped channel regions 56c and 56d. The second mask layer is stripped off, and a third mask layer is formed on the third silicon film 64. Impurities are ion-implanted into the second silicon film 60 under medium acceleration energy, and the doped channel regions 60c and 60d are formed in the second silicon film 60. The third mask layer is removed, and a fourth mask layer is provided on the third silicon film 64. Impurities are ion-implanted into the third silicon film 64 under small acceleration energy, and the doped channel regions 64d, 64e and 64f are formed in the third silicon film 64.

The memory block thus arranged further decreases the occupation area of the real estate, and the mask programmable read only memory device is further improved in integration density without enlarging the silicon substrate. The silicon nitride film 66 prevents the thin-film transistors of the memory sub-blocks 70d from undesirable mobile ions, and is conducive to stability of the threshold levels thereof.

Although particular embodiments of the present invention have been shown and described, it will be obvious to those skilled in the art that various changes and modifications may be made without departing from the spirit and scope of the present invention. For example, conductivity types in the description are inversive, and the memory sub-blocks may be stacked more than four levels. Each of the memory sub-blocks may contain more than three memory transistors, and each bit line may not be shared between memory sub-blocks. If so, any switching transistor is not inserted between the associated bit line and a series of memory transistors.

What is claimed is:

1. A process of fabricating a mask programmable read only memory device on a semiconductor substrate of a first conductivity type, comprising the steps of:
   a) preparing said semiconductor substrate;
   b) selectively growing a first gate insulating film over a major surface of said semiconductor substrate;
   c) forming a plurality of first gate electrodes on said first gate insulating film at spacings;
   d) forming first source and drain regions of a second conductivity type in said semiconductor substrate in such a manner that said first gate insulating film, said plurality of first gate electrodes and said first source and drain regions are connected in series combination to form enhancement mode first field effect transistors;
   e) covering said plurality of first gate electrodes with a second gate insulating film;
   f) forming a semiconductor film of said first conductivity type on said second gage insulating film in such a manner as to extend over said plurality of first gate electrodes;
   g) providing a first mask film on said semiconductor film having through holes exposing parts of said semiconductor film over a first set of gate electrodes selected from said plurality of first gate electrodes; then
   h) implanting impurities of said second conductivity type at relatively large acceleration energy, and doping said semiconductor substrate under said first gate electrodes so as to selectively convert said enhancement mode first field effect transistors into depletion mode first field effect transistors;
   i) removing said first mask film;
   j) providing a second mask film on said semiconductor film having through holes covering parts of said semiconductor film over a second set of gate electrodes selected from said plurality of first gate electrodes;
   k) implanting impurities of said second conductivity type into said semiconductor film at relatively small acceleration energy, and doping said semiconductor film except for said parts, the gate electrodes under said parts,
   wherein said second gate insulating film and said parts are connected in combination to form enhancement mode second field effect transistors, and the other of said gate electrodes, said second gate insulating film and said semiconductor film except for said parts are connected in combination to form depletion mode second field effect transistors,
   said depletion mode second field effect transistors and said enhancement mode second field effect transistors being mixed for forming a series combination of second field effect transistors; and l) completing said mask programmable read only memory device.

2. A process as set forth in claim 1, in which said step j) comprises the substeps of: j-1) depositing an oxide film over the entire surface, j-2) patterning a photo resist film for forming said second mask film, and j-3) patterning said oxide film for exposing said semiconductor film.

3. A process as set forth in claim 1, in which said step l) comprises the substeps of: l-1) removing said second mask film, l-2) depositing a refractory metal film over said oxide film left on said semiconductor film as well as over exposed semiconductor film, and l-3) applying heat to said semiconductor film overlain by said refractory metal film so as to form a refractory metal silicide film.

* * * * *